United States Patent [19]

Cuomo et al.

[11] 4,381,453
[45] Apr. 26, 1983

[54] SYSTEM AND METHOD FOR DEFLECTING AND FOCUSING A BROAD ION BEAM

[75] Inventors: Jerome J. Cuomo, Lincolndale; James M. E. Harper, Yorktown Heights, both of N.Y.

[73] Assignee: International Business Machines Corporation, Armonk, N.Y.

[21] Appl. No.: 221,661

[22] Filed: Dec. 31, 1980

[51] Int. Cl.³ .............................................. H01J 37/08
[52] U.S. Cl. .................................. 250/398; 250/452.2
[58] Field of Search ...................... 250/396, 398, 492.2, 250/492.3; 328/229; 313/361.1; 60/202

[56] References Cited

U.S. PATENT DOCUMENTS 2,762,916  9/1956  Van Overbeek ..................... 328/229
3,629,578 12/1971  LePoole ............................... 250/398
3,913,320 10/1975  Reader et al. ........................ 60/202

Primary Examiner—Bruce C. Anderson
Attorney, Agent, or Firm—Philip Young; Ronald L. Drumheller

[57] ABSTRACT

A method and system for deflecting a broad ion plasma beam which includes an ion source for forming an ion plasma, an extraction means for extracting a broad ion plasma beam from the ion plasma, and deflection means including a non-grounded surface located in the path of the ion plasam beam and at an angle to the path for deflecting the ion plasma beam to a target material. A grounded, screen grid is located in front of the deflecting means in the path of the ion plasma. The screen grid has openings which permit passage of the ions in the ion plasma, but block passage of the electrons. The plasma beam is deflected by the deflection means and the grounded, screen grid onto the target material for sputter cleaning, deposition and ion milling applications.

17 Claims, 6 Drawing Figures

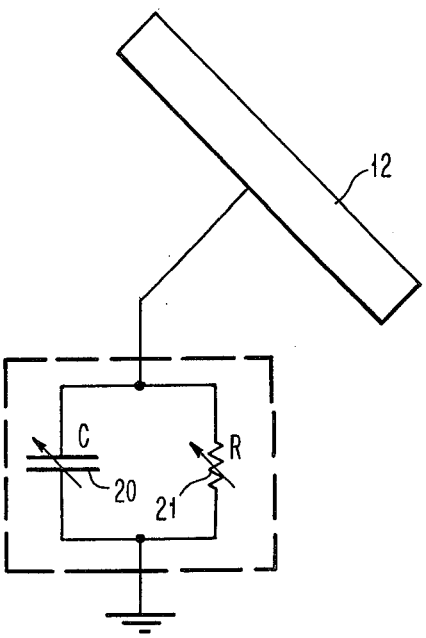
FIG. 2.1
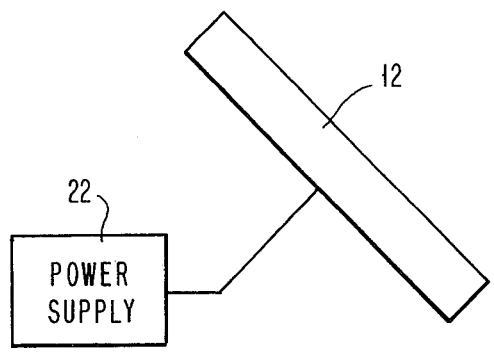
FIG. 2.2
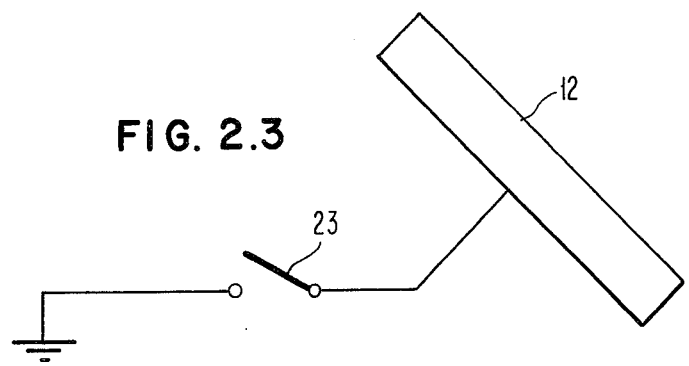
FIG. 2.3

SYSTEM AND METHOD FOR DEFLECTING AND FOCUSING A BROAD ION BEAM

BACKGROUND OF THE INVENTION

The present invention relates to processes for the fabrication of semiconductor and thin film devices, and more particularly to the deflection and focusing of broad ion plasma beams.

DESCRIPTION OF THE PRIOR ART

Ion plasma beams of large diameter, e.g. 10 cm or more are of increasing use in the processes such as ion milling, ion beam deposition, wafer cleaning, and planarization. In most of these processes, additional flexibility would be gained by being able to easily deflect or focus the broad ion beam. One example is the precleaning of substrates by ion milling prior to ion beam deposition. Another example is the ability to easily convert an ion milling system into a high current density deposition system.

Prior art discloses charged particle beams which are deflected by charged surfaces or magnets since the beams are composed primarily of positively charged particles. By contrast, ion plasma beams are relatively broad beams composed of both ions and electrons and are not purely charged positive ions. Therefore, such broad plasma beams have not successfully been deflected by prior art techniques because of such presence of electrons.

It is an object of the present invention to provide a simple technique for deflecting and focusing large diameter ion plasma beams without the need for detailed electronic control. It is another object to provide a technique for deflecting and focusing broad ion plasma beams in a self-adjusting manner.

SUMMARY OF THE INVENTION

These, and other objects, are achieved by the present invention which provides a system and a method for deflecting and focusing a broad ion plasma beam wherein the beam is deflected by a surface which is held at a predetermined control voltage or by self-charging from the ion beam. There the surface is an electrically floating, charged surface, the surface is self-charged to a voltage that is determined by the beam potential. In one embodiment, the deflecting surface is placed at a forty-five degree angle on the part of the beam.

Additional control of the beam deflection is achieved by locating a grounded, mesh screen grid parallel to the deflecting surface for the purpose of confining the electric field to the region of the deflecting surface. The grounded grid has openings sized to pass the ions, but not the electrons, through the grid to the deflecting surface.

BRIEF DESCRIPTION OF THE DRAWINGS

FIGS. 2.1, 2.2 and 2.3 show three alternate forms of the control means for the ion beam deflecting surface;

DESCRIPTION OF THE PREFERRED EMBODIMENTS

Figure 1:
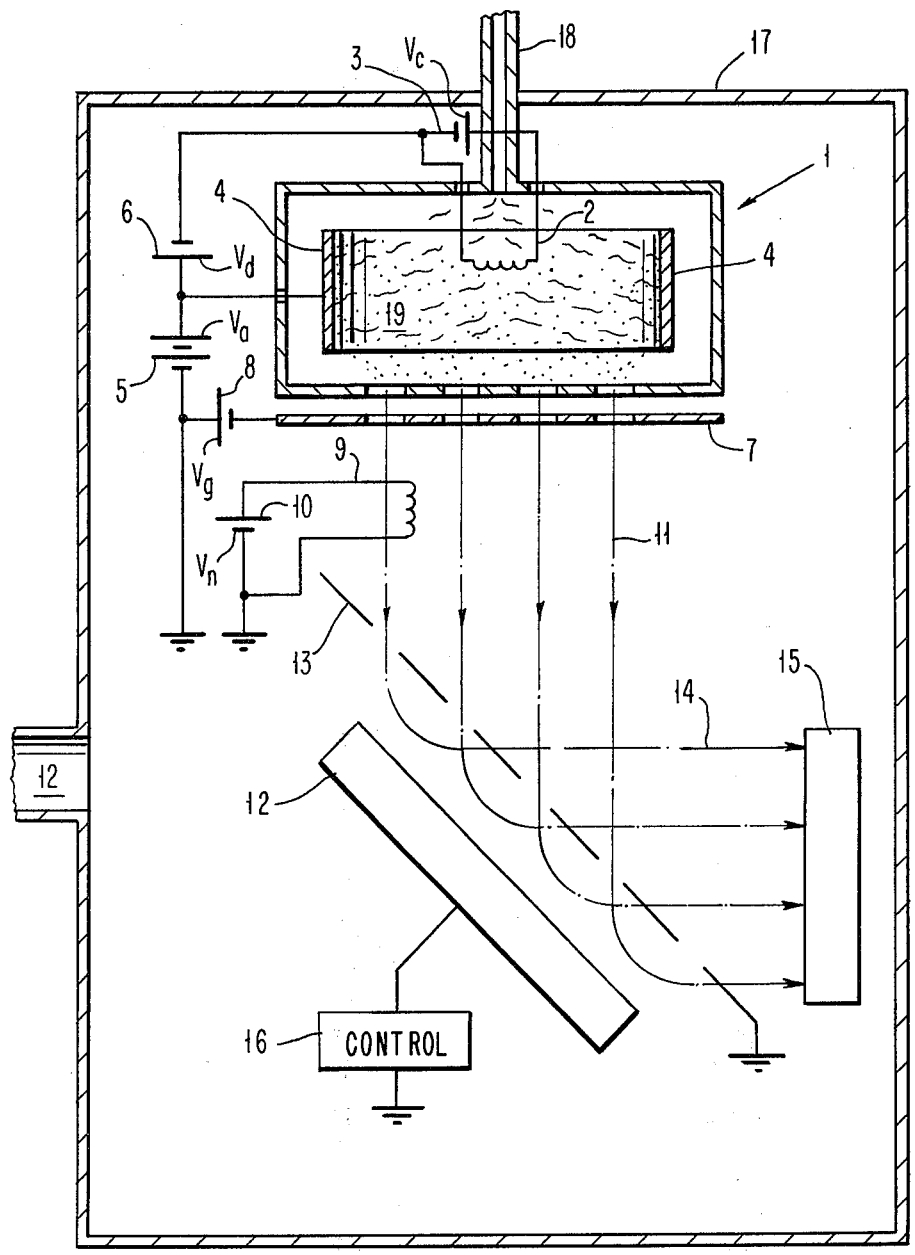
FIG. 1 is a schematic diagram of an ion beam system in accordance with the present invention.

FIG. 1 is a schematic diagram of an ion beam system in accordance with the present invention. Generally, the system includes an ion source 1 for treating a target material 15 contained within a vacuum chamber 17. The ion source 1 can be a conventional source, such as the "Kaufman source" described in U.S. Pat. No. 3,913,320 issued to H. R. Kaufman and P. D. Reader. Specifically, the ion source 1 includes a thermionic cathode 2 powered by a power supply located within the chamber 17 and an anode 4 adjacent the ion source walls and made of non-magnetic material such as stainless steel. An anode power supply 5 provides a voltage Va. Also, a discharge power supply 6 provides a discharge voltage Vd. An accelerator grid power supply 8 provides a voltage Vg to a single or multi extraction grid 7.

Argon gas is provided into the ion source 1 through a gas inlet 18. The gas is ionized by electrons from the cathode 2 which are accelerated to the anode 4. The multi-aperture accelerator grid 7 is shown at the lower end of the ion source. A plasma 19 is formed by the ions and electrons in the ion source chamber and provides a source of ions for the ion beam. These ions are extracted from the plasma 19 to the apertures in the accelerator grid 7 and form a beam shown by the ion trajectory lines 11 in FIG. 1.

Electrons are added to the beam 11 from a neutralizer 9 to prevent charging up of the target 15. The neutralizer 9 is powered from a supply 10 of voltage Vn:

FIG. 1 shows a broad Argon ion beam 11 generated by the ion source 1. Such a beam may be more than 10 centimeters in diameter. Normally, the material to be treated by the ion beam is placed directly in the path of the beam. However, the present invention accomplishes deflection of the beam 11 with a surface 12 placed at a 45° angle in the path of the beam 11. Surface 12 is allowed to charge up with positive charge. This is achieved either with an insulator, for example glass, or a metal surface not connected to ground. When enough positive charge has accumulated, the ion beam 11 no longer strikes the surface 12, but is deflected. For an angle of 45°, it can be shown that the surface 12 charges up to about ½ the beam voltage, and deflects the beam by 90° as shown by beam lines 14.

Better control of the beam deflection is achieved by placing a grounded grid 13 parallel to the deflecting surface 12. Grid 13 is a highly transparent, metal mesh screen having openings which are less than the Debye length of the electrons in the ion beam plasma 11. For example, with an argon plasma beam, the Debye length is typically 0.1 mm and, therefore, the mesh grid opening is less than 0.1 mm. Thus, essentially the electrons do not pass through the mesh grid 13, but rather the ions go through and are deflected by the surface 12. This confines the deflecting electric field to the region of surface 12 and does not disturb the ion trajectories before or after deflection. Also, the presence of grid 13 allows the ion beam to be neutralized by added electrons, in regions indicated by the beams 11 and 14, which prevent the beam from spreading due to space charge repulsion.

As described above, when the ion beam is directed at the insulating surface 12, such surface is allowed to charge up to the potential of the ions in the beam 11. At this point, the incoming ions will no longer strike the charged surface but will be deflected according to the angle of the surface. According to one embodiment, the deflecting surface 12 is electrically floating. According to another embodiment, the deflecting surface 12 can have a potential determined by a control means 16. Control means 16 may take either of the three forms shown in FIGS. 2.1, 2.2 and 2.3. That is, the control means may comprise a capacitor 20 of variable value and resistor 21 of variable value as shown in FIG. 2.1. Alternatively, the control means 16 may comprise a power supply 22 to allow beam deflection by a controlled voltage means as shown in FIG. 2.2 The control means 16 may also contain a switch 23 allowing direct connection to ground, for sputter deposition as shown in FIG. 2.3.

Figure 3:
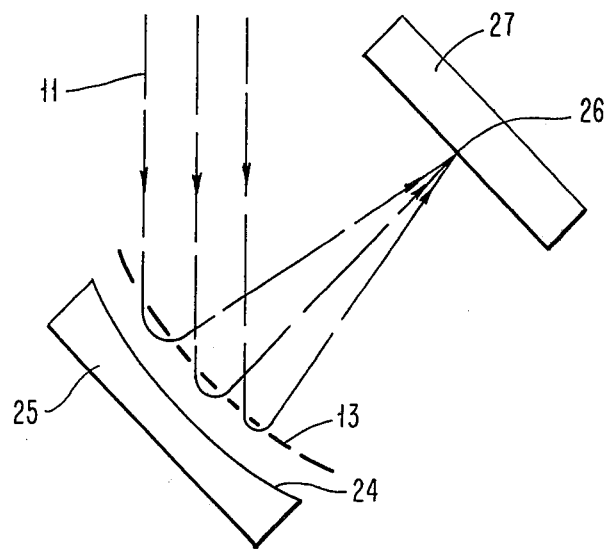
FIG. 3 shows a curved deflecting surface for focusing of the ion beam.

Focusing of the ion beam may be achieved with this method by using an appropriately curved surface 24 as shown in FIG. 3. The curved surface 24 on the deflecting member 25 acts like a curved reflecting mirror to direct the ions to a common focal point 26.

The advantages of this beam deflection technique are:
1. Simplicity—the angle of the surface 12 determines the angle of deflection;
2. Self adjusting—the charge on the surface 12 adjusts to the appropriate level to repel ions. Thus, it is self adjusting.
3. The technique can be readily employed in existing ion beam systems such as are used for ion milling.

One application for the technique of the present invention is in precleaning of substrates prior to film deposition. The substrates located in the position of target 15 can be sputter cleaned by the deflected ion beam. Using the control means shown in FIG. 2.3, by closing a switch 23, the deflecting surface 12 is then grounded and the ion beam sputters the surface 12, the beam no longer being deflected. Now the substrates are coated with material removed from surface 12 by sputter deposition.

The technique of the present invention can also be used for conversion of an ion milling system to a high current density deposition system. By replacing the conventional wafer holder with a curved concave reflecting surface 24 as in FIG. 4, the ion beam is deflected and focused to point 26. A target 27 is placed at the focal point, and is sputtered at a high rate by the high current density in the focused beam. The sputtered material from the target 27 is then deposited on wafers 28.

The technique of the present invention also provides a high intensity ion milling system. The focused ion beams of FIGS. 3 and 4 provide high rate ion milling near the focal point.

Figure 4:
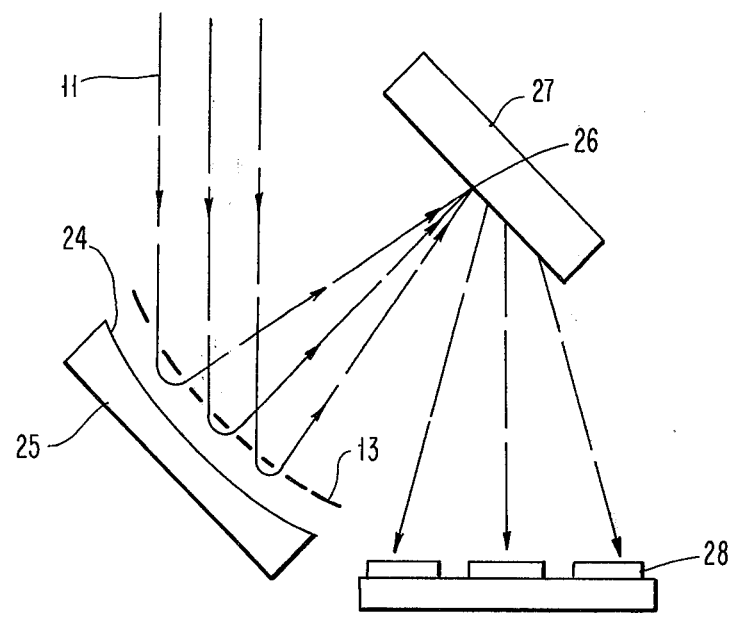
FIG. 4 shows a high current density deposition system employing the deflecting techniques of the present invention.

With the configuration shown in FIG. 4, one can raster the beam across a target surface or easily move the beam from one target to another for multilayering materials. This is achieved by changing the angle of the deflecting surface which then changes the direction of the deflected ion beam.

While the invention has been particularly shown and described with reference to preferred embodiments thereof, it will be understood by those skilled in the art that the foregoing and other changes in form and details may be made therein without departing from the spirit and scope of the invention.

Having thus described our invention, what we claim as new and desire to secure as Letters Patent is:

1. A system for deflecting a broad ion plasma beam, comprising:
   a ion source for forming an ion plasma;
   extraction means for extracting a broad ion plasma beam from said ion plasma in said ion source;
   deflection means including a non-grounded surface located in the path of said ion plasma beam and positioned at an angle to said path for deflecting said ion plasma beam to a target material; and
   a grounded screen grid located in front of said deflection means in the path of said ion plasma beam, said screen grid having openings which permit passage of the ions in said ion plasma beam but which block passage of the electrons in said ion plasma beam;
   whereby said ion plasma beam is deflected by said deflection means and said grounded screen grid onto said target material.

2. System as recited in claim 1, wherein said deflection means comprises an insulator material that charges to a voltage that is determined by the ion plasma beam.

3. System as recited in claim 1, wherein said deflection means comprises a metal that is non-grounded.

4. System as recited in claim 1, wherein said deflection means is mounted with its deflection surface at an angle of about forty-five degrees to the ion plasma beam.

5. System as recited in claim 1, wherein said deflection means comprises a concave reflecting surface for focusing said ion plasma beam towards a focal point.

6. System as recited in claim 5, wherein said target material is located near said focal point of said concave reflecting surface.

7. System as recited in claim 6, wherein said target material is sputtered by said focused ion plasma beam, and the sputtered material is deposited on a wafer.

8. System as recited in claim 1, wherein said grounded screen grid is positioned parallel to said non-grounded surface of said deflection means thereby confining an electric field generated by said non-grounded surface to the region of said non-grounded surface.

9. System as recited in claim 1, wherein said grounded screen grid has openings which are less than the Debye length of the electrons in the ion plasma beam.

10. System as recited in claim 1, further comprising control means electrically connected to said deflection means for controlling the voltage potential of said non-grounded surface.

11. System as recited in claim 10, wherein said control means comprises both a capacitor means and a resistor means connected between said non-grounded surface and ground.

12. System as recited in claim 10, wherein said control means comprises a voltage supply connected to said non-grounded surface.

13. System as recited in claim 10, wherein said control means comprises switch means for connecting said non-grounded surface to electrical ground for the purpose of sputter deposition.

14. System as recited in claim 1, wherein said ion source provides an ion plasma beam which is more than 10 centimeters in diameter.

15. A method for deflecting a broad ion plasma beam, comprising:
   forming an ion plasma in an ion source;
   extracting a broad ion plasma beam from said ion plasma;
   deflecting said ion plasma beam to a target material using a deflecting surface located in the path of said ion plasma beam and at an angle to said path; and confining the deflecting electric field to the region of the deflecting surface by locating a grounded screen grid in front of said deflecting surface in the path of said ion plasma, said screen grid having openings which permit passage of the ions in said ion plasma beam, but which block passage of the electrons in said ion beam; whereby said ion plasma beam is deflected by said deflection means and said grounded screen grid onto said target material.

16. Method as recited in claim 15, where in said step of extracting a broad ion plasma beam a beam is extracted having a diameter greater than 10 centimeters.

17. Method as recited in claim 15, wherein said grounded screen grid has openings which are less than the Debye length of the electrons in the ion plasma beam.

* * * * *